US008497523B2

(12) United States Patent
Chen

(10) Patent No.: US 8,497,523 B2
(45) **Date of Patent: *Jul. 30, 2013**

(54) LIGHT EMITTING DIODE PACKAGE

(75) Inventor: Yi-Wen Chen, New Taipei (TW)

(73) Assignee: Everlight Electronics Co., Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/545,000

(22) Filed: Jul. 10, 2012

(65) Prior Publication Data

US 2012/0273833 A1 Nov. 1, 2012

Related U.S. Application Data

(63) Continuation of application No. 12/703,795, filed on Feb. 11, 2010, now Pat. No. 8,242,531.

(30) Foreign Application Priority Data

Feb. 25, 2009 (TW) .............................. 98106001 A

(51) Int. Cl.
*H01L 33/00* (2010.01)

(52) U.S. Cl.
USPC ............................................................ 257/99

(58) Field of Classification Search
USPC .................................................. 257/99, 100
See application file for complete search history.

(56) References Cited

U.S. PATENT DOCUMENTS 6,054,716 A 4/2000 Sonobe et al.
2008/0142831 A1 6/2008 Su
2009/0267104 A1 10/2009 Hsu et al.

FOREIGN PATENT DOCUMENTS

| | | |
|---|---|---|
| CN | 1873975 | 12/2006 |
| CN | 101030572 | 9/2007 |
| CN | 201163006 | 12/2008 |
| TW | M261831 | 4/2005 |
| TW | M318795 | 9/2007 |
| TW | 200742114 | 11/2007 |
| TW | 200841496 | 10/2008 |

*Primary Examiner* — Jae Lee
*Assistant Examiner* — Grant Withers
(74) *Attorney, Agent, or Firm* — Han IP Law PLLC

(57) ABSTRACT

A light emitting diode (LED) package including a carrier, a housing, at least one LED chip and at least one electrostatic discharge protector (ESD protector) is provided. The housing encapsulating a portion of the carrier has at least one first opening, at least one second opening and a barricade. The barricade separates the first opening from the second opening. The first opening and the second opening expose a first surface of the carrier. The LED chip is disposed on the first surface of the carrier, located in the first opening, and electrically connected to the carrier. The ESD protector is disposed on the first surface of the carrier, located in the second opening, and electrically connected to the carrier.

16 Claims, 4 Drawing Sheets

200 220 222 228b T 224 228a 240 210 226 250 270 230 I T 260 224 240 I' 226 270 228a

LIGHT EMITTING DIODE PACKAGE

CROSS-REFERENCE TO RELATED APPLICATIONS

This application is a continuation of U.S. patent application Ser. No. 12/703,795, filed on Feb. 11, 2010, which claims the priority benefit of Taiwan Application Serial No. 98106001, filed on Feb. 25, 2009. The above-identified applications are herein incorporated by reference in their entirety.

TECHNICAL FIELD

The present invention relates to a light emitting diode (LED) package, and more particularly, to an LED package separating an LED chip and an electrostatic discharge (ESD) protector with a housing.

BACKGROUND

Due to the advantages of long lifetime, small size, vibration resistance, low heat emission, and low power consumption, LEDs have been widely applied in various home appliances and instruments as indicators or light sources. With recent development towards multicolor and high illumination, the applications of the LEDs are extended to large-sized outdoor billboards, traffic lights, etc. In the future, the LEDs may become the power-saving and environment-protecting light sources in replacement of tungsten filament lamps and mercury vapor lamps.

FIG. 1A is a schematic top view illustrating a conventional LED package. FIG. 1B is a schematic cross-sectional view taken along line I-I' of the LED package in FIG. 1A. Referring to FIG. 1A and FIG. 1B simultaneously, a conventional LED package 100 includes a leadframe 110, a housing 120, an LED chip 130, an ESD protector 140, a plurality of conductive wires 150, and an encapsulant 160. The housing 120 encapsulates a portion of the leadframe 110 and has an opening 122. The LED chip 130 and the ESD protector 140 are disposed on the leadframe 110 and located in the opening 122. Moreover, the LED chip 130 and the ESD protector 140 are electrically connected to the leadframe 110 through the conductive wires 150 respectively. In addition, the encapsulant 160 encapsulates the LED chip 130, the ESD protector 140, and the conductive wires 150.

When the LED chip 130 of the conventional LED package 100 is driven by the current to emit light, a portion of the light beam emitted by the LED chip 130 is emitted from the transparent encapsulant 160 to be away from the leadframe 110 after being reflected by the white housing 120. Since the ESD device 140 of the conventional LED package 100 is a non-transparent protector, when the LED chip 130 is driven by the current to emit light, the non-transparent ESD protector 140 then receives a portion of the light beam emitted by the LED chip 130. Hence, the light emitting intensity of the conventional LED package 100 is affected by the non-transparent ESD protector 140.

SUMMARY

The present invention provides an LED package, which prevents an ESD protector from absorbing the light beam emitted by an LED chip.

The present invention provides an LED package including a carrier, a housing, at least an LED chip, and at least an ESD protector. The housing encapsulates a portion of the carrier and has at least one first opening, at least one second opening, and a barricade separating the first opening and the second opening. The first opening and the second opening expose a first surface of the carrier. The LED chip is disposed on the first surface of the carrier, located in the first opening, and electrically connected to the carrier. The ESD protector is disposed on the first surface of the carrier, located in the second opening, and electrically connected to the carrier.

In one embodiment of the present invention, the first surface of the carrier is a flat surface, and the LED chip, the ESD protector, and the barricade of the housing are all disposed on the flat surface.

In one embodiment of the present invention, the LED package further includes a first encapsulant, filled in the first opening of the housing and encapsulating the LED chip. The first encapsulant is a transparent encapsulant.

In one embodiment of the present invention, the LED package further includes a second encapsulant, filled in the second opening of the housing and encapsulating the ESD protector.

In one embodiment of the present invention, when the material of the first encapsulant is identical to the material of the second encapsulant, the barricade of the housing has a second surface facing away from the carrier. The second surface has a trench connecting the first opening and the second opening. The first encapsulant or the second encapsulant is filled in the trench. Moreover, the height of the bottom of the trench relative to the carrier is greater than the height of the surface of the LED chip facing away from the carrier relative to the carrier.

In one embodiment of the present invention, the ESD protector includes a zener diode chip, an LED chip, a Schottky diode chip, a surface mount device (SMD) zener diode package, an SMD LED package, an SMD Schottky diode package, or a capacitor.

In one embodiment of the present invention, when the ESD protector includes the zener diode chip, the LED chip, the Schottky diode chip, the SMD zener diode package, the SMD LED package, or the SMD Schottky diode package, the LED chip and the ESD protector are connected in reverse parallel.

In one embodiment of the present invention, the carrier is a leadframe.

In one embodiment of the present invention, the material of the housing is plastic, metal, or metal oxide.

In one embodiment of the present invention, the second opening is located at a corner portion of the housing.

In one embodiment of the present invention, the first opening is located at a center portion of the housing and the second opening is located at the periphery of the first opening.

In light of the foregoing, the barricade of the housing in the present invention is located between the ESD protector and the LED chip. Thus, the ESD protector is prevented from absorbing the light beam emitted by the LED chip.

In order to make the aforementioned and other features and advantages of the present invention more comprehensible, several embodiments accompanied with figures are described in detail below.

A light emitting diode (LED) package, comprising: a carrier having a first surface; a housing encapsulating a portion of the carrier and including a first opening, a second opening, and a barricade separating the first opening and the second opening, wherein the first opening and the second opening expose the first surface of the carrier, the barricade of the housing has a second surface facing away from the carrier, the second surface has a trench connecting the first opening and the second opening; and an LED chip disposed on the first surface of the carrier, located in the first opening of the housing, and electrically connected to the carrier.

In one embodiment, a height of a bottom of the trench relative to the carrier is greater than a height of a surface of the LED chip facing away from the carrier relative to the carrier.

In one embodiment, the first surface of the carrier is a flat surface, and the LED chip and the barricade of the housing are disposed on the first surface of the carrier.

In one embodiment, the carrier comprises a leadframe.

In one embodiment, a material of the housing comprises plastic, metal, or metal oxide.

In one embodiment, the second opening is located at a corner portion of the housing.

In one embodiment, the first opening is located at a center portion of the housing and the second opening is located at a periphery of the first opening.

In one embodiment, the LED package further comprises an electrostatic discharge (ESD) protector disposed on the first surface of the carrier, located in the second opening of the housing, and electrically connected to the carrier.

In one embodiment, the ESD protector comprises a zener diode chip, an LED chip, a Schottky diode chip, a surface mount device (SMD) zener diode package, an SMD LED package, an SMD Schottky diode package, or a capacitor.

In one embodiment, the LED chip and the ESD protector are connected in reverse parallel when the ESD protector comprises a zener diode chip, a LED chip, a Schottky diode chip, a SMD zener diode package, a SMD LED package, or a SMD Schottky diode package.

In one embodiment, the ESD protector is disposed on the first surface of the carrier.

In one embodiment, the LED package further comprises a first encapsulant filled in the first opening of the housing and encapsulating the LED chip.

In one embodiment, the first encapsulant comprises a transparent encapsulant.

In one embodiment, the LED package further comprises a second encapsulant filled in the second opening of the housing and encapsulating the ESD protector.

In one embodiment, a material of the first encapsulant and a material of the second encapsulant are identical.

In one embodiment, the first encapsulant or the second encapsulant is filled in the trench.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
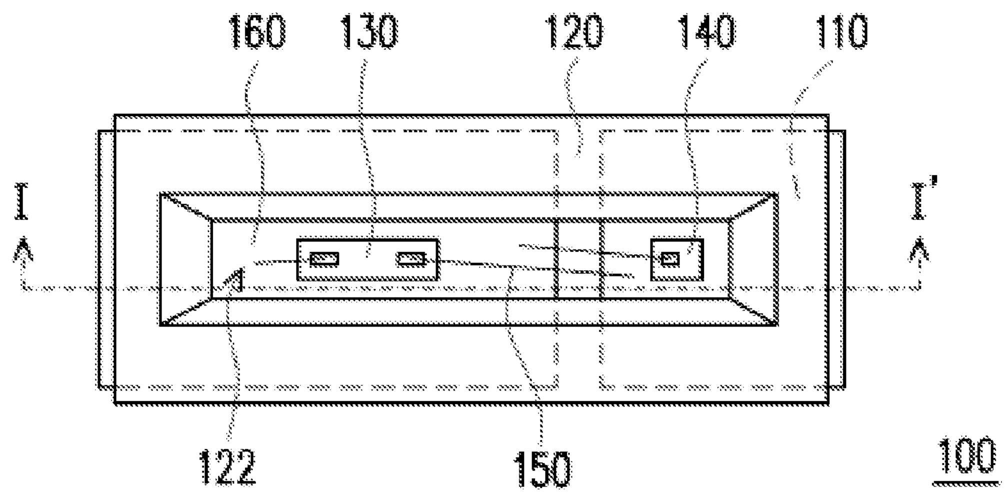
FIG. 1A is a schematic top view illustrating a conventional LED package.
Figure 1B:
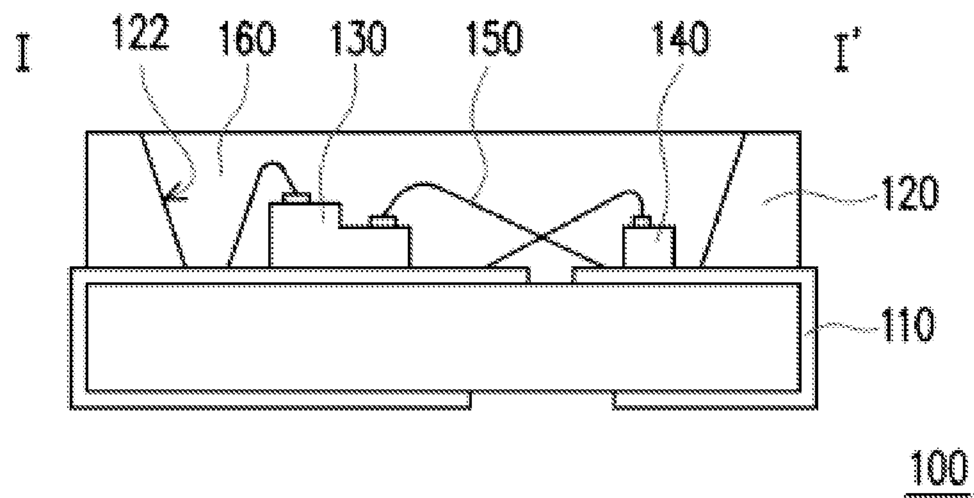
FIG. 1B is a schematic cross-sectional view taken along line I-I' of the LED package in FIG. 1A.
Figure 2A:
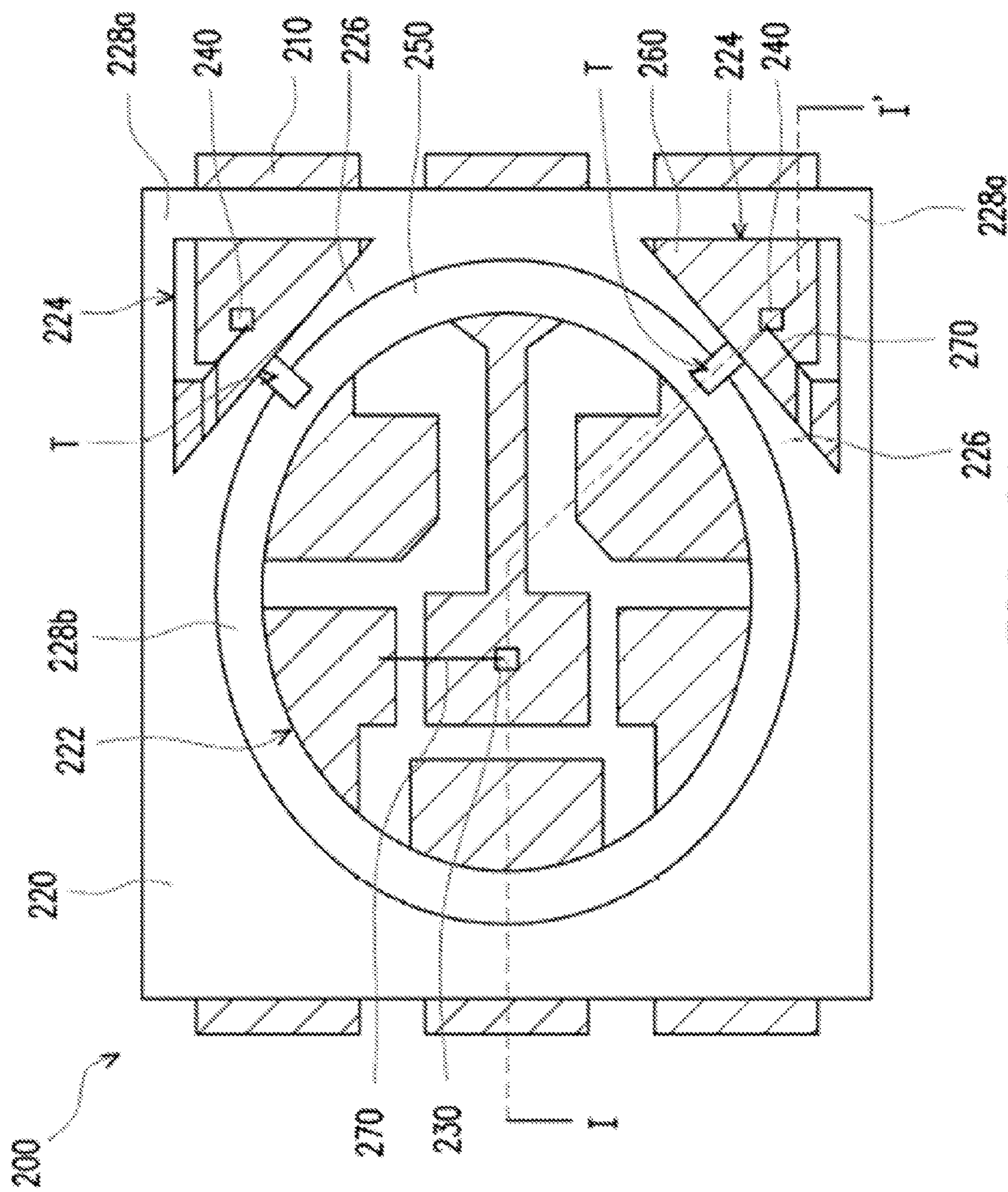
FIG. 2A is a schematic top view illustrating an LED package according to an embodiment of the present invention.
Figure 2B:
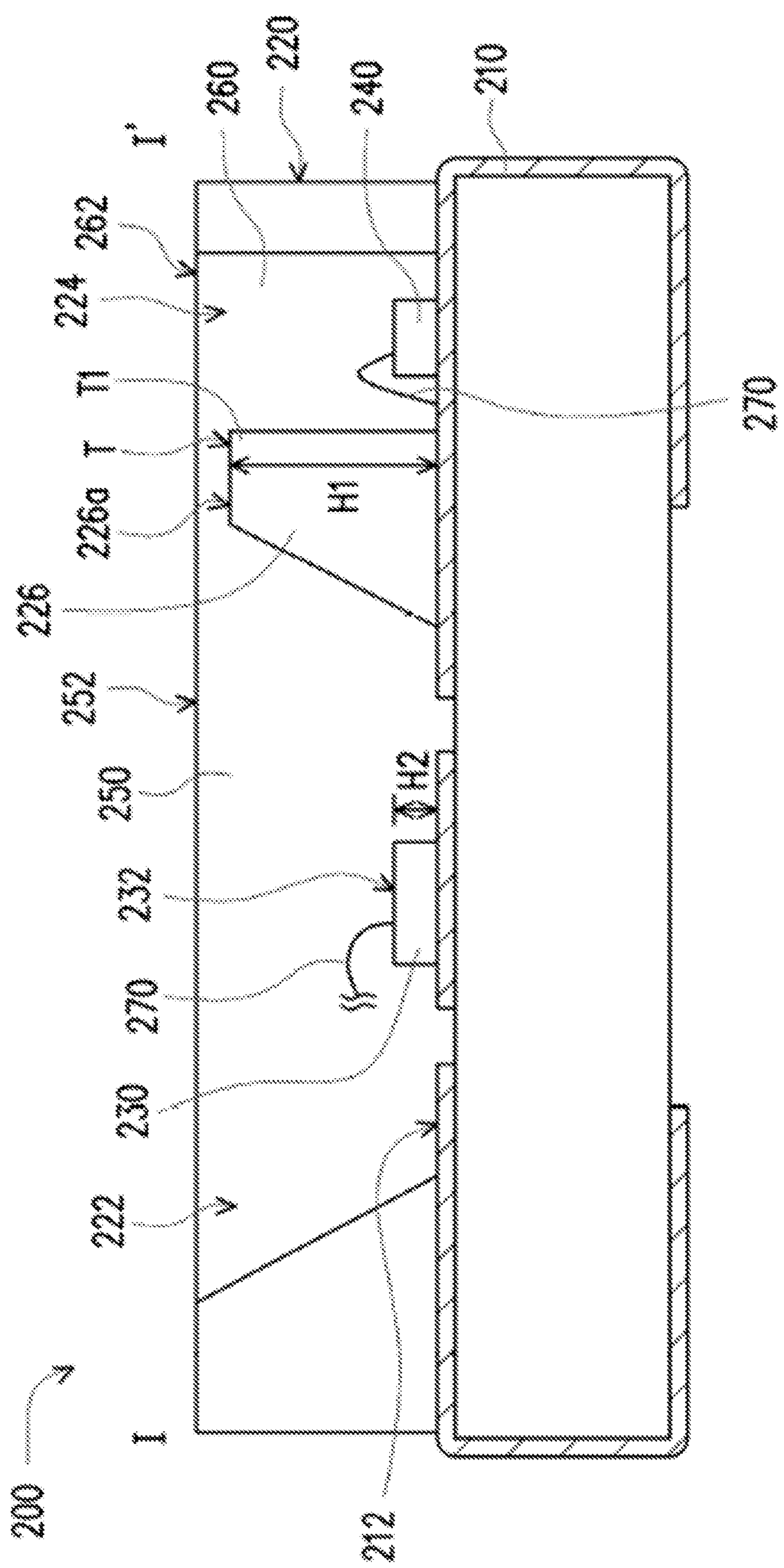
FIG. 2B is a schematic cross-sectional view taken along line I-I' of the LED package in FIG. 2A.

FIG. 2A is a schematic top view illustrating an LED package according to an embodiment of the present invention. FIG. 2B is a schematic cross-sectional view taken along line I-I' of the LED package in FIG. 2A.

Referring to FIG. 2A and FIG. 2B simultaneously, an LED package 200 of the present invention includes a carrier 210, a housing 220, an LED chip 230, and a plurality of ESD protectors 240. Here, the carrier is a leadframe, for instance.

The housing 220 encapsulates a portion of the carrier 210 and has a first opening 222, a plurality of second openings 224, and a plurality of barricades 226. The barricade 226 separates the first opening 222 and the second openings 224. The first opening 222 and the second openings 224 expose a first surface 212 of the carrier 210. In the present embodiment, the second openings 224 are located at a plurality of corner portions 228*a* of the housing 220. Moreover, the first opening 222 is disposed at a center portion 228*b* of the housing 220. The second openings 224 are located at the periphery of the first opening 222.

In the present embodiment, the material of the housing 220 is plastic, metal, or metal oxide. For example, the material of the housing 220 is epoxy, glass fiber, titanium oxide, calcium oxide, ceramics, a combination thereof, or other suitable materials.

The LED chip 230 is disposed on the first surface 212 of the carrier 210 and located in the first opening 222. In addition, the LED chip 230 can be electrically connected to the carrier 210 through a conductive wire 270. In another embodiment, the LED chip 230 can be electrically connected to the carrier 210 through a plurality of bumps (not shown). In other words, the LED chip 230 can be flip chip interconnected to the carrier 210.

The ESD protector 240 is disposed on the first surface 212 of the carrier 210 and located in the second opening 224. The ESD protector 240 can also be electrically connected to the carrier 210 through the conductive wire 270. Specifically, in the present embodiment, the barricade 226 is located between the ESD protector 240 and the LED chip 230 to prevent the ESD 240 from absorbing the light beam emitted by the LED chip 230, so as to enhance the light emitting intensity of the LED package 200. In the present embodiment, the first surface 212 of the carrier 210 is a flat surface, and the LED chip 230, the ESD protector 240, and the barricade 226 of the housing 220 are all disposed on the flat surface.

In the present embodiment, the ESD protector 240 includes a zener diode chip, an LED chip, a Schottky diode chip, an SMD zener diode package, an SMD LED package, an SMD Schottky diode package, a capacitor, or other devices suitable for ESD.

Figure 3:
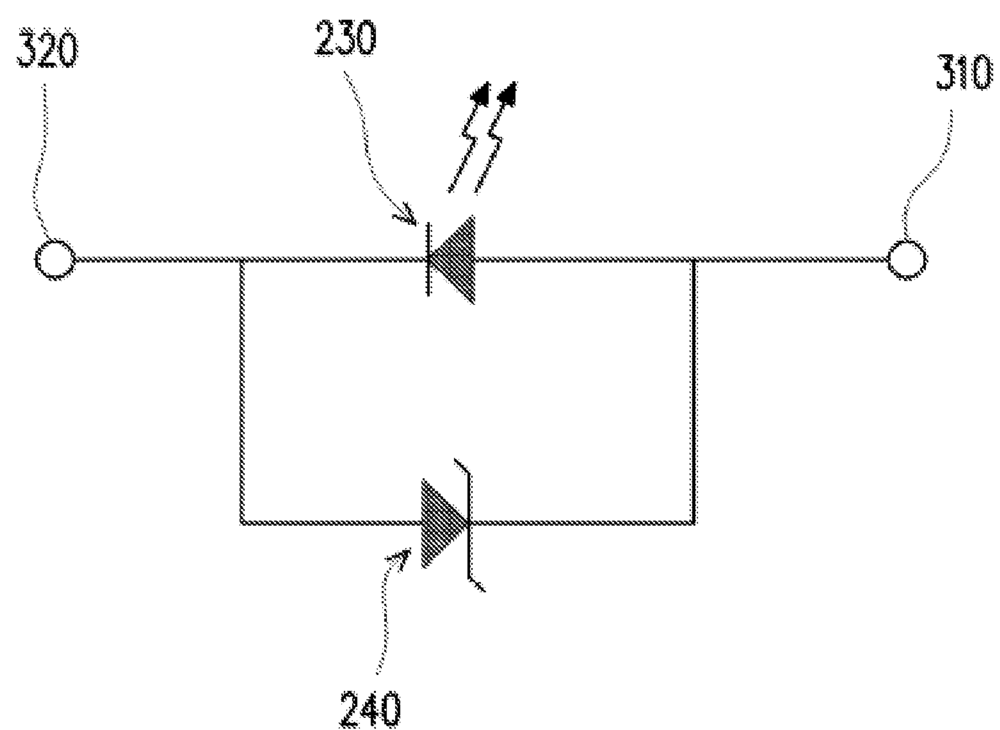
FIG. 3 is a schematic view of an ESD circuit according to an embodiment of the present invention.

In the present embodiment, when the ESD protector 240 is the zener diode chip, the LED chip, the Schottky diode chip, the SMD zener diode package, the SMD LED package, or the SMD Schottky diode package, the LED chip 230 and the ESD protector 240 are connected in reverse parallel. FIG. 3 is a schematic view of an ESD circuit according to an embodiment of the present invention. Referring to FIG. 3, the LED chip 230 is connected to a high voltage terminal 310 and a low voltage terminal 320, and the ESD protector 240 is connected to the LED chip 230 in reverse parallel. That is, the anode of the ESD protector 240 is electrically connected to the cathode of the LED chip 230. Furthermore, the cathode of the ESD protector 240 is electrically connected to the anode of the LED chip 230. Therefore, when static electricity is conducted in from the low voltage terminal 320, the static electricity can be conducted out through the path of the ESD protector 240 to prevent the static electricity from damaging the LED chip 230.

Besides, in the present embodiment, a first encapsulant 250 encapsulates the LED chip 230 and the conductive wire 270, and fills the first opening 222 of the housing 220. The first encapsulant 250 is, for example, a transparent encapsulant, i.e. epoxy resin, silicone, or UV-cured gel.

Also, in the present embodiment, a second encapsulant 260 encapsulates the ESD protector 240 and the conductive wire 270, and fills the second opening 224 of the housing 220. The second encapsulant 260 can be a transparent encapsulant or a non-transparent encapsulant, and the material of the second encapsulant 260 may be identical to the material of the first encapsulant 250.

In the present embodiment, when the material of the first encapsulant 250 is identical to the material of the second encapsulant 260, the barricade 226 of the housing 220 has a second surface 226*a* facing away from the carrier 210. The second surface 226*a* may include a trench T connecting the first opening 222 and the second opening 224. Moreover, the first encapsulant 250 or the second encapsulant 260 is filled in the trench T. A height H1 of the bottom T1 of the trench T relative to the carrier 210 is greater than a height H2 of a surface 232 of the LED chip 230 facing away from the carrier 210 relative to the carrier 210. When the first encapsulant 250 and the second encapsulant 260 are being formed, the trench T facilitates the flowing between the two encapsulants so as to obtain surfaces 252, 262 that are level to each other, thereby preventing the overflow of the two encapsulants or the protrusion of surfaces 252, 262 due to excessive encapsulants.

In summary, the barricade of the housing in the present invention is located between the ESD protector and the LED chip. Thus, the ESD protector is prevented from absorbing the light beam emitted by the LED chip so that the light emitting intensity of the LED package is enhanced. In addition, when the first encapsulant and the second encapsulant are being formed, the trench on the barricade facilitates the flowing between the two encapsulants to obtain surfaces that are level to each other, thereby preventing the overflow of the two encapsulants or the protrusion of encapsulant surfaces due to excessive encapsulants.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A light emitting diode (LED) package, comprising:

a carrier having a first surface;

a housing encapsulating a portion of the carrier and including a first opening, a second opening, and a barricade separating the first opening and the second opening, wherein the first opening and the second opening expose the first surface of the carrier, the barricade of the housing has a second surface facing away from the carrier, the second surface has a trench connecting the first opening and the second opening; and an LED chip disposed on the first surface of the carrier, located in the first opening of the housing, and electrically connected to the carrier.

2. The LED package as recited in claim 1, wherein a height of a bottom of the trench relative to the carrier is greater than a height of a surface of the LED chip facing away from the carrier relative to the carrier.

3. The LED package as recited in claim 1, wherein the first surface of the carrier is a flat surface, and wherein the LED chip and the barricade of the housing are disposed on the first surface of the carrier.

4. The LED package as recited in claim 1, wherein the carrier comprises a leadframe.

5. The LED package as recited in claim 1, wherein a material of the housing comprises plastic, metal, or metal oxide.

6. The LED package as recited in claim 1, wherein the second opening is located at a corner portion of the housing.

7. The LED package as recited in claim 6, wherein the first opening is located at a center portion of the housing and the second opening is located at a periphery of the first opening.

8. The LED package as recited in claim 1, further comprising:

an electrostatic discharge (ESD) protector disposed on the first surface of the carrier, located in the second opening of the housing, and electrically connected to the carrier.

9. The LED package as recited in claim 8, wherein the ESD protector comprises a zener diode chip, an LED chip, a Schottky diode chip, a surface mount device (SMD) zener diode package, an SMD LED package, an SMD Schottky diode package, or a capacitor.

10. The LED package as recited in claim 8, wherein the LED chip and the ESD protector are connected in reverse parallel when the ESD protector comprises a zener diode chip, a LED chip, a Schottky diode chip, a SMD zener diode package, a SMD LED package, or a SMD Schottky diode package.

11. The LED package as recited in claim 8, wherein the ESD protector is disposed on the first surface of the carrier.

12. The LED package as recited in claim 1, further comprising:

a first encapsulant filled in the first opening of the housing and encapsulating the LED chip.

13. The LED package as recited in claim 12, wherein the first encapsulant comprises a transparent encapsulant.

14. The LED package as recited in claim 12, further comprising:

a second encapsulant filled in the second opening of the housing and encapsulating the ESD protector.

15. The LED package as recited in claim 14, wherein a material of the first encapsulant and a material of the second encapsulant are identical.

16. The LED package as recited in claim 14, wherein the first encapsulant or the second encapsulant is filled in the trench.

* * * * *